(12) United States Patent
Hsieh

(10) Patent No.: US 6,873,632 B2
(45) Date of Patent: Mar. 29, 2005

(54) TECHNIQUES FOR BIASING LASERS

(75) Inventor: John Hsieh, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/228,563

(22) Filed: Aug. 27, 2002

(65) Prior Publication Data

US 2003/0219051 A1 Nov. 27, 2003

Related U.S. Application Data

(60) Provisional application No. 60/382,455, filed on May 22, 2002.

(51) Int. Cl.[7] .................................................. H01S 3/00
(52) U.S. Cl. ............................ 372/38.02; 372/38.07; 372/38.01
(58) Field of Search ........................... 372/38.01, 38.02, 372/38.04, 38.07, 29.015, 29.012

(56) References Cited

U.S. PATENT DOCUMENTS

| | | | | | |
|---|---|---|---|---|---|
| 5,287,375 | A | * | 2/1994 | Fujimoto | 372/38.02 |
| 5,966,395 | A | * | 10/1999 | Ikeda | 372/38.01 |
| 6,055,252 | A | * | 4/2000 | Zhang | 372/38.02 |
| 6,292,497 | B1 | * | 9/2001 | Nakano | 372/38.02 |
| 2001/0046242 | A1 | * | 11/2001 | Kawakami et al. | 372/38.02 |
| 2001/0046243 | A1 | * | 11/2001 | Schie | 372/38.02 |

* cited by examiner

*Primary Examiner*—Minsun Oh Harvey
*Assistant Examiner*—James Menefee
(74) *Attorney, Agent, or Firm*—Workman Nydegger

(57) ABSTRACT

A method of biasing a laser that includes determining a threshold current of a laser and setting a bias current for the laser as a factor of the threshold current.

17 Claims, 4 Drawing Sheets

TECHNIQUES FOR BIASING LASERS

CROSS-REFERENCE TO RELATED APPLICATION

This application claims priority from U.S. Provisional Application Ser. No. 60/382,455, filed on May 22, 2002.

TECHNICAL FIELD

This disclosure relates to biasing lasers.

BACKGROUND

Lasers, such as vertical-cavity surface-emitting lasers (VCSEL), Fabry-Perot (FP) lasers and distributed feedback (DFB) lasers, can have wide variations in their performance. An optical assembly, such as an optical transmitter or an optical transceiver, may require that the laser be tuned by setting the direct-current (DC) bias and alternating-current (AC). Characteristics of the lasers that may vary include the laser threshold current ($I_{th}$), slope efficiency, wavelength and over-temperature behavior. The variations in these characteristics may require a different biasing current depending on the desired response of the assembly.

SUMMARY OF THE DISCLOSURE

In one aspect, a method is disclosed for biasing a laser that includes determining a threshold current of a laser, and setting a bias current for the laser as a factor of the threshold current.

A second aspect is an article comprising a computer-readable medium storing computer-executable instructions that when applied to a computer system, cause the computer system to perform the method disclosed above.

Some implementations may include one or more of the following features. For example, the laser bias current may be set as a factor of the laser threshold current and/or the slope efficiency. Other implementations may include setting the laser bias current a predetermined amount above the laser threshold current.

Other implementations may include one or more of the following advantages. The techniques may provide an increase in yield for lasers installed in laser assemblies. Also, the lasers may be operated away from the performance limits of the laser. Operation of the lasers away from the performance limits may improve the average quality of the eye diagram and may increase the operating life of the laser.

Various features and advantages will be readily apparent from the following detailed description, the accompanying drawings and the claims.

BRIEF DESCRIPTION OF THE DRAWINGS

Like reference symbols in the various drawings indicate like elements.

DETAILED DESCRIPTION

Figure 1:
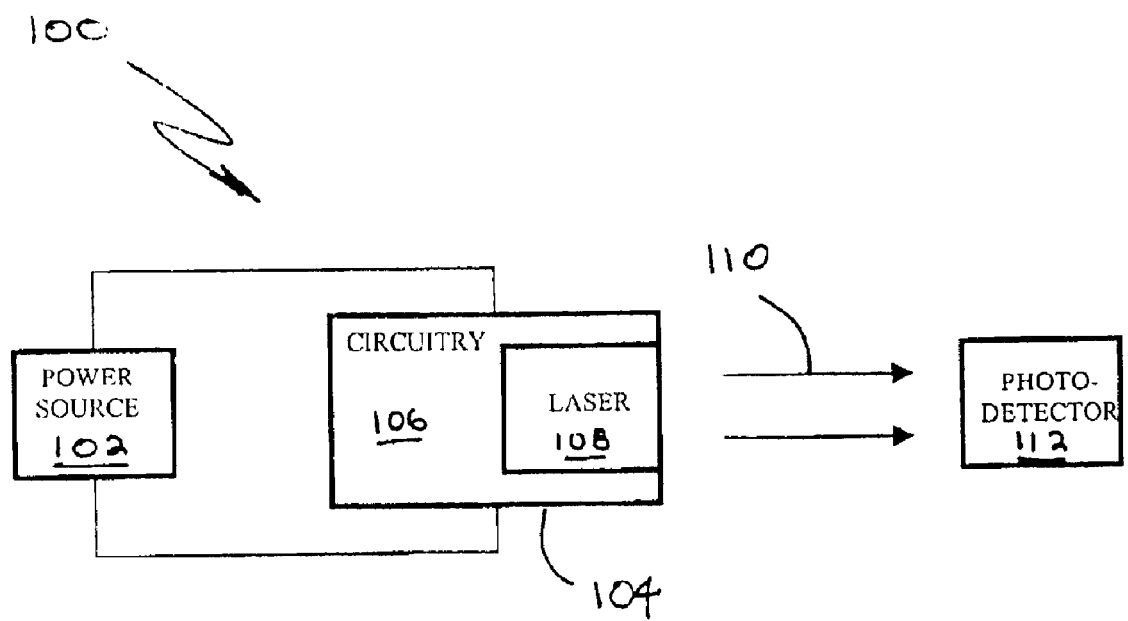
FIG. 1 is a block diagram of a system including an optical assembly.

FIG. 1 is a block diagram of a laser assembly 100 such as an optical transceiver or transmitter. A power source 102 is coupled to an optical assembly 104. The optical assembly includes circuitry 106 and a laser 108. Circuitry 106 may be used to bias, drive or otherwise provide current to the laser 108. Laser 108 can be made to emit laser light 110. A photo-detector 112 may be used to measure an output power of the emitted light 110.

Figure 2:
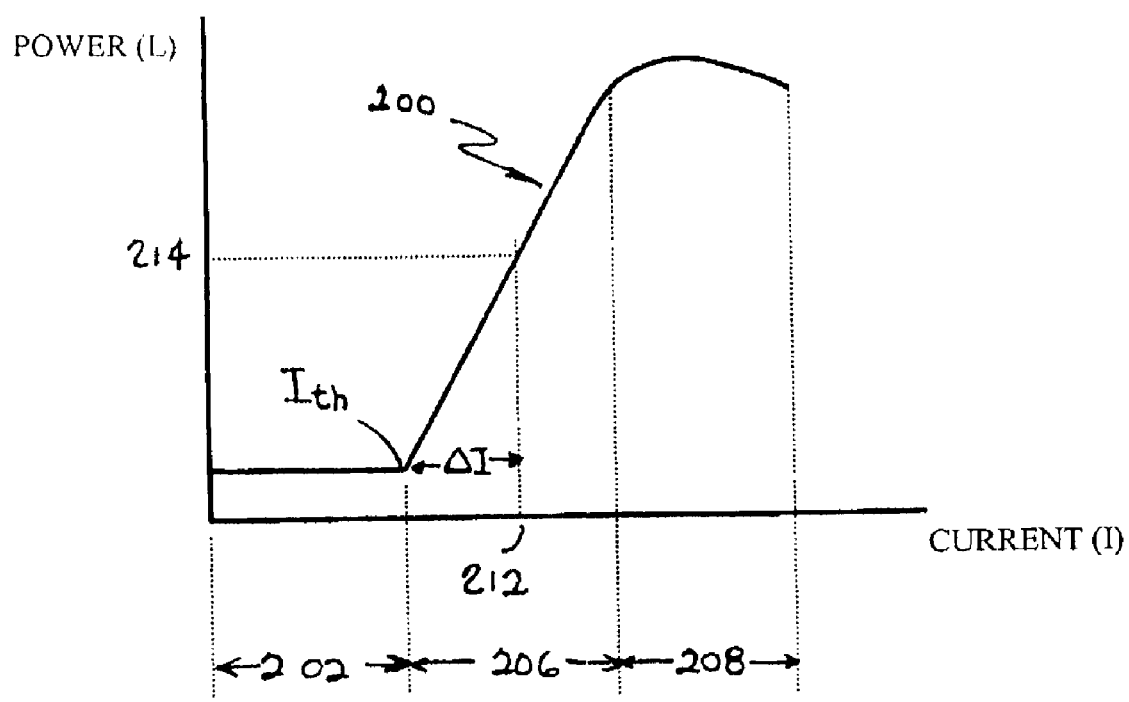
FIG. 2 is an illustration of a laser response curve.

FIG. 2 illustrates a generalized L-I curve 200 for an optical assembly. An L-I curve is a technique for characterizing the performance of a laser. In an L-I curve, the laser output power (L) can be plotted as a function of an electrical current (I) being passed through the optical assembly. For example, a current 212 through a laser characterized by L-I curve 200 produces an output power 214. The first region 202 of the curve is substantially flat. In this region the electrical current supplied to the laser does not result in a significant output of light from the optical assembly.

As the current through the laser increases, a current threshold (Ith) is reached where the laser begins to produce a significant output light power. The threshold current may be highly variable between lasers of the same type and even lasers from the same manufacturing lot.

At currents greater than Ith, there is a linear region 206 of the L-I curve where the laser light output is substantially proportional to the current applied to the laser. The proportionality constant may be called the slope efficiency (SE). In the linear region 206 of the L-I curve, the laser speed is proportional to $\Delta I/Ith$ where $\Delta I$ is the amount of current above the threshold current Ith. As with the threshold current Ith, the slope efficiency may vary greatly from laser to laser.

The L-I curve "rolls over" in a region 208, at current levels above the linear region 206. In the roll-over region 208 the light output is not directly proportional to the current applied. The roll-over region may also be characterized by undesirable laser characteristics including jitter (small variations in the emitted light waveform), shorter life, unstable power output, slower reaction time and distortion of the eye diagram (the viewing of multiple waveforms superimposed upon each other and may provide a subjective measure of the variations in the waveform, for example, jitter).

Figure 3:
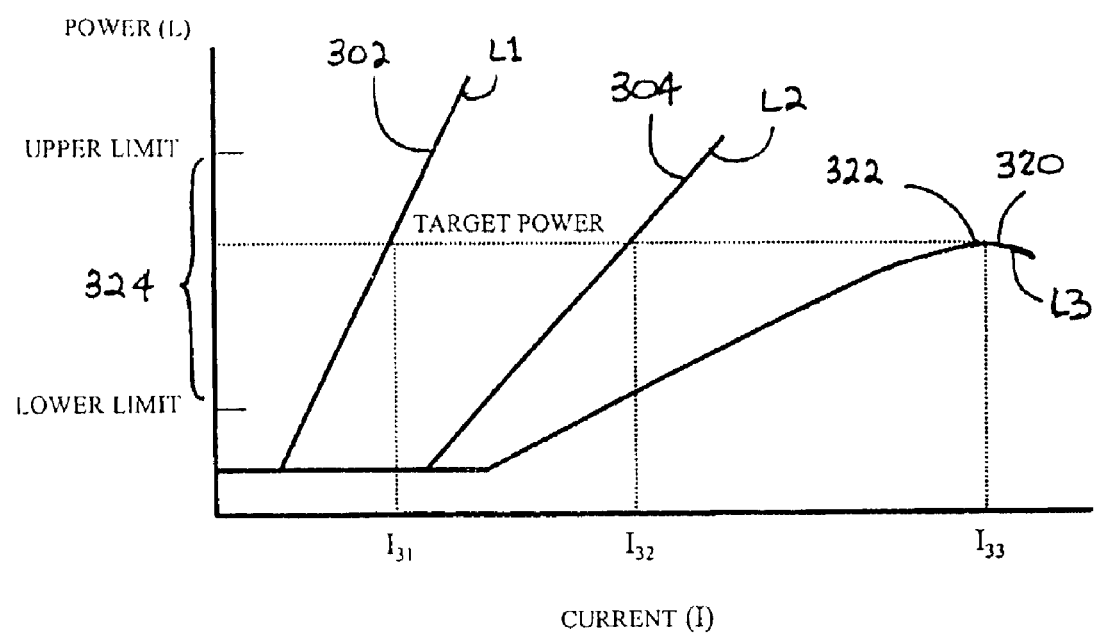
FIG. 3 is an illustration of biasing a family of laser response curves to achieve a target power output.

FIG. 3 illustrates three L-I curves 302, 304, 320 representing three lasers, L1, L2 and L3, respectively, which may have been selected from a lot of lasers received from a supplier. The lasers may be specified to operate so that a laser output power is in a desired range of values 324 between a lower limit and an upper limit. A target laser power within the output range may be determined. Lasers in the lot are biased to achieve the target laser power. Because L1, L2 and L3 may have different L-I curves, the biasing requirements of the lasers may be different to achieve a similar output power. In the illustrated example, laser L1 requires a smaller current $I_{31}$ in order to achieve the same laser target output power as laser L2 which requires a current $I_{32}$. Laser L3 may be required to operate in the roll-over region 322 operating at a current $I_{33}$.

Figure 4:
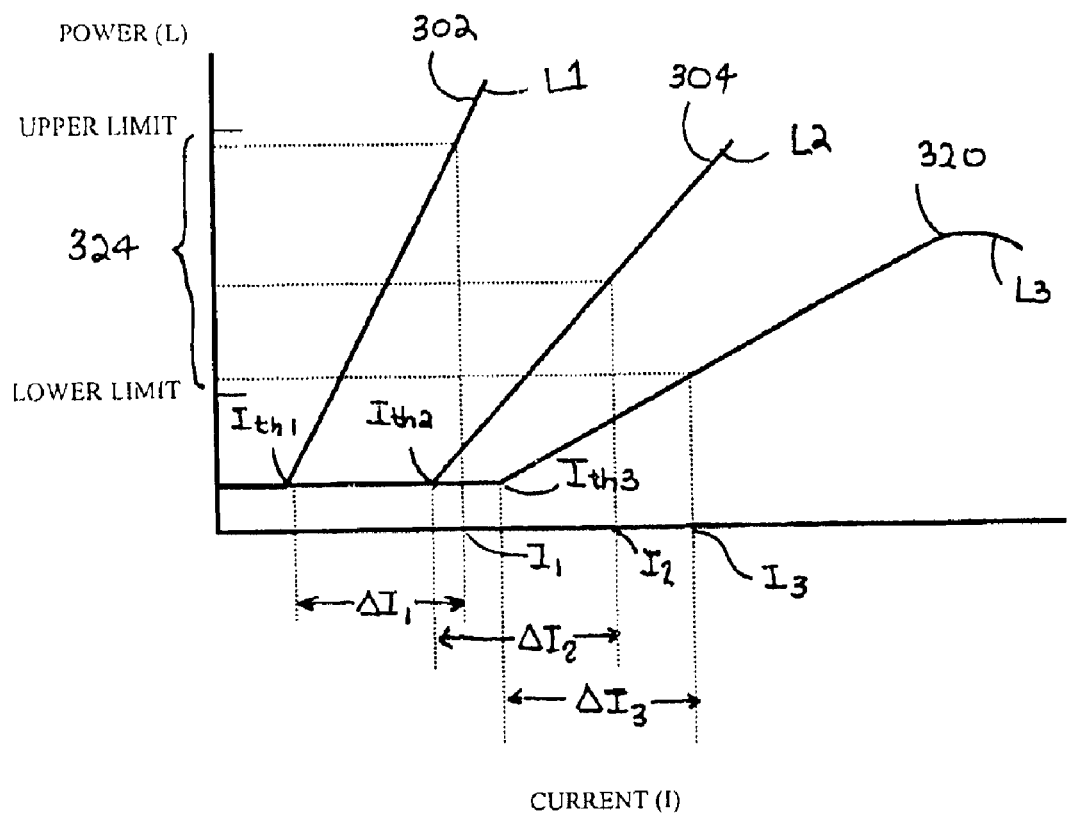
FIG. 4 is an illustration of biasing the family of laser response curves of FIG. 3 to achieve a power output within a predetermined range.

FIG. 4 illustrates a method of tuning the laser bias. The laser bias may be set after the laser is installed into the optical assembly. It is assumed that the lasers do not need to meet the same target output power. Instead, the bias of each laser is set to achieve a power that is within the optical assembly specification with a $\Delta I$ large enough for adequate laser speed and within the roll-off region.

In the example illustrated in FIG. 4, the laser power is set so that the optical assembly output power is within the desired output range 324 after the laser is installed in the optical assembly. In this example, laser L1 is biased at a current $I_1$ which is $\Delta I_1$ above the L1 threshold current (Ith1). That current is large enough for improved laser speed compared to FIG. 3.

Referring again to FIG. 4, a laser having the L-I curve of L2 may be biased at a current $I_2$ which is $\Delta I_2$ above the L2 threshold current ($I_{th2}$) to provide an output power within the desired output range. The optical assembly may be designed to source less current than if the bias were set to achieve the target output power illustrated in FIG. 3. The bias current $I_2$ (FIG. 4) is lower than the bias current $I_2$ (FIG. 3) corresponding to the target power output.

A laser having the L-I curve of L3 may be biased at a current $I_3$ which is $\Delta I_3$ above the L3 threshold current ($I_{th3}$) to provide an output power within the desired output range. The laser can provide the desired output at an adequate speed without operating in the roll-over region 322 of the L-I curve 320.

The current $\Delta I_x$ may be determined from the magnitude of the threshold current ($I_{thx}$) of a particular laser used in an optical assembly. Fiber optic transmitter performance may be characterized by key parameters including, but not limited to, jitter mask margin and power output. These parameters may be affected by a DC bias applied to the laser diode.

A preferred DC bias may be used to select a preferred jitter, mask margin performance and power requirement for a particular laser. The preferred DC bias setting bias setting may differ for each laser type—vertical-cavity surface-emitting laser (VCSEL), Fabry-Perot (FP) laser or a distributed feed-back (DFB) laser—and may vary even within the same laser type. The DC bias setting may also vary for the same laser type supplied by different vendors. The preferred DC bias laser setting for a particular laser may be selected as a derivative of the threshold current ($I_{th}$) of the particular laser.

In one implementation, the current $\Delta I$ can be set to a fixed current above the threshold current ($I_{th}$). This may be described mathematically as:

$$I_{opt} = I_{th} + x \qquad (Eq.\ 1)$$

where $I_{opt}$ is the preferred bias current and $I_{th}$ is the threshold current for particular laser. Equation 1 describes a relationship where the preferred bias is a constant value above the threshold current of the laser. The value of "x" may be determined experimentally and may be substantially constant for lasers of a particular type from the same vendor.

In another implementation, the current $\Delta I$ can be set to a predetermined percentage above the threshold current ($I_{th}$). For example, it may be determined that a VCSEL used in a transceiver should have a current $\Delta I$ equal to 200% of the threshold current ($I_{th}$). Thus, a laser with a threshold current ($I_{th}$) of 2 milliamps (mA) would be biased to 4 mA in a transceiver assembly. A FP laser may require a current $\Delta I$ equal to 250% above threshold current ($I_{th}$). Thus a FP laser assembly might be biased to 5 mA. This may be described mathematically as:

$$I_{opt} = I_{th} * k \qquad (Eq.\ 2)$$

Equation 2 describes a relationship where the preferred bias is a fixed multiple of the threshold current of the laser. The value of "k" may be determined experimentally and may be substantially constant for lasers of a particular type from the same lot.

In another implementation, the current $\Delta I$ may be determined from a combination of the threshold current (Ith) and slope efficiency (SE) of the laser. For example, the current $\Delta I$ can be set to a percentage of the threshold current ($I_{th}$) plus a percentage of the slope efficiency. Other combinations of the threshold current ($I_{th}$) and slope efficiency (SE) may be used as well.

$$I_{opt} = (I_{th}*k) + (SE*y) \qquad (Eq.\ 3)$$

$$I_{opt} = (I_{th}*k) / (SE*y) \qquad (Eq.\ 3b)$$

Equations 3a and 3b describe relationships where the preferred bias is related to the slope efficiency (SE) as well as to $I_{th}$. The value of where "k" and "y" may be determined experimentally and may be substantially constant for lasers of a particular type from the same vendor.

Other formulae may be determined that describe a preferred DC laser bias derived from the laser threshold current. As one example, the current $\Delta I$ may be determined from a combination of the threshold current ($I_{th}$), slope efficiency (SE) and the roll-over current of the L-I curve.

EXAMPLE #1

In one example, Eq. 1 was applied to Honeywell 850 nanometer (nm) implant VCSELs used in the manufacturing of Finisar Corporation's (Sunnyvale, Calif.) FTRJ-85XX-7D-XX product family of transceivers. In this example a value of "x" was determined as follows:

(1) A group of transceiver samples was selected from a production lot population. The samples were chosen to represent the entire population lot;

(2) $I_{th}$ of the laser used in a first transceiver sample was determined;

(3) A DC bias current 3 mA above $I_{th}$ was used to setup the laser in the first transceiver sample. For example, if $I_{th}$ was 4 mA, the total current applied to the laser was 7 mA;

(4) The extinction ratio was adjusted to meet the specification of the transceiver;

(5) The jitter, mask margin, and power were measured and recorded;

(6) Items (3) through (5) were repeated using successively higher bias current levels above $I_{th}$ (e.g., 4 mA, 5 mA, 6 mA, and so on) until a preferred laser bias current setting had been exceeded. An excessive bias current was determined as an increase in jitter beyond a predetermined acceptable limit, a decrease in mask margin below a predetermined acceptable value or a movement of output power from within to without a predetermined acceptable band;

(7) Items (3) through (6) were repeated with the remaining previously selected samples from the population lot, and a preferred current setting above Ith for each sample was measured and recorded; and (8) The value of "x" in Eq. 1 to be used for the entire population of the transceivers was determined as an average of the preferred bias currents above $I_{th}$ for all of the samples selected from the lot.

The data collected for the Honeywell 850 nm implant VCSEL is shown in Table 1. In this implementation, the laser bias was set using Eq. 1 with x=6.5 mA.

TABLE 1

| Current above $I_{th}$ (m)A | Jitter (ps) | Mask Margin (%) | Power (dBm) |
|---|---|---|---|
| 3 mA | 53.3 | 38 | −7.81 |
| 5 mA | 35.6 | 47 | −5.91 |
| 7 mA | 37.8 | 45 | −4.81 |
| 9 mA | 51.1 | 32 | −3.64 |

In a second implementation, the laser bias was set to 7.5 mA above $I_{th}$ for the Mitsubishi 1310 FP laser used in Finisar Corporation's FTRJ-13XX-7D-XX transceiver products.

EXAMPLE #2

In this example, Eq. 2 may be applied for determining the bias current levels for Honeywell 850 nm oxide VCSELs.

(1) A group of transceiver samples was selected from a production lot population. The samples were chosen to represent the entire population lot;

(2) $I_{th}$ of the laser used in a first transceiver sample was determined;

(3) $I_{th}$ was multiplied by a "k" value of 2.0. The result was the bias current for setting up the laser. For example, if $I_{th}$ was 3 mA, the total current applied to the laser was 6 mA;

(4) The extinction ratio was adjusted to meet specification;

(5) The jitter, mask margin, and power were measured and recorded;

(6) Items (3) through (5) were repeated using successively higher "k" values (e.g., 1.3, 1.4, 1.5, and so on) until a preferred laser bias current setting has been exceeded;

(7) Items (3) through (6) were repeated with the remaining previously selected samples from the population and the preferred "k" value for each such sample was measured and recorded.

(8) The value of "k" in Eq. 2 was determined as an average of the optimal "k" from the samples.

Various features of the system can be implemented in hardware, software, or a combination of hardware and software. For example, some aspects of the system can be implemented in computer programs executing on programmable computers. Each program can be implemented in a high level procedural or object-oriented programming language to communicate with a computer system.

Furthermore, each such computer program can be stored on a storage medium, such as read-only-memory (ROM), readable by a general or special purpose programmable computer, for configuring and operating the computer when the storage medium is read by the computer to perform the functions described above. Other implementations are within the scope of the following claims.

What is claimed is:

1. A method for setting a bias current for lasers used in laser assemblies, the method comprising:
    determining a threshold current of a plurality of laser samples that are selected from a lot of lasers;
    applying a plurality of bias currents to the laser samples;
    adjusting an extinction ratio to specification for each bias current;
    measuring a jitter, a mask margin, and a power of each sample laser for each bias current, wherein the jitter, mask margin, and power define a preferred laser setting;
    when the preferred laser setting is exceeded, determining a preferred laser bias current for each sample laser;
    averaging the preferred laser bias currents to identify an average bias current; and
    setting the average laser bias current as a bias current for each laser in the lot of lasers.

2. The method of claim 1, further comprising installing each laser in a laser assembly.

3. The method of claim 2, wherein the laser assembly is an optical receiver or transceiver.

4. The method of claim 2, wherein the average bias current is dependent on the type of laser installed in the laser assembly.

5. The method of claim 1, wherein applying a plurality of bias currents to the laser samples further comprises at least one of:
    selecting each bias current as a fixed value above a threshold current of each of the plurality of laser samples;
    selecting each bias current as a predetermined percentage above the threshold current of each laser sample; and
    selecting each bias current as a combination of the threshold current and a slope efficiency of each laser sample.

6. A method for setting a bias current for a group of optical transceivers, the optical transceivers each having a laser selected from a group of lasers the method comprising:
    for each sample laser selected from a group of lasers:
        determining a threshold current of each sample laser;
        determining a slope efficiency of each sample laser;
        determining a roll-off bias current for the sample laser to cause the sample laser output power to fall within a roll-off region; and
        determining a preferred bias current for each sample laser based on the threshold current, the slope efficiency and the roll-off bias current; and
    averaging the bias current from each of the sample lasers to determine an average bias current; and
    setting the average bias current as a bias current for each optical transceiver that includes a laser from the group of lasers.

7. The method of claim 6, further comprising applying additional bias currents to each sample laser to determine the preferred bias current.

8. The method of claim 7, wherein determining a preferred bias current for each sample laser based on the threshold current further comprises:
    adjusting an extinction ratio to meet a specification of each sample laser; and
    measuring a current setting until the current setting is exceeded by a particular bias current, the current setting including a measurement of a jitter, a mask margin, and a power of each sample laser.

9. A computer program product for use in a computer system, the computer program product comprising a computer-readable medium storing computer-executable instructions for implementing a method for setting a bias current for a plurality of lasers, the method comprising:
    determining a threshold current of a plurality of laser samples;
    applying a plurality of bias currents to the laser samples;
    adjusting an extinction ratio to specification for each bias current;
    measuring a jitter, a mask margin, and a power of each sample laser for each bias current, wherein the jitter, mask margin, and power define a preferred laser setting;

when the preferred laser setting is exceeded, determining a preferred laser bias current for each sample laser;

averaging the preferred laser bias currents to identify an average bias current; and setting the average laser bias current as a bias current for each laser in the lot of lasers.

10. A computer program product for use in a computer system, the computer program product comprising a computer-readable medium storing computer-executable instructions for implementing a method for setting a bias current for a group of optical transceivers, the optical transceivers each having a laser selected from a group of lasers, the method comprising:

for each sample laser selected from a group of lasers:
determining a threshold current of each sample laser;
determining a slope efficiency of each sample laser;
determining a roll-off bias current for the sample laser to cause the sample laser output power to fall within a roll-off region; and
determining a preferred bias current for each sample laser based on the threshold current, the slope efficiency and the roll-off bias current; and averaging the bias current from each of the sample lasers to determine an average bias current; and setting the average bias current as a bias current for each optical transceiver that includes a laser from the group of lasers.

11. In a system that includes a group of transceivers having lasers, the lasers having different threshold currents, a method for setting a bias current for each transceiver such that substantially each transceiver in the group of transceivers achieves a power within a specification of each transceiver and a ΔI that is large enough for adequate laser speed and within a roll-off region, the method comprising:

determining a threshold current for one or more sample transceivers selected from a group of transceivers, each transceiver having a laser from a particular group of lasers;

applying a plurality of bias currents to each sample;

determining a preferred bias current for each sample transceiver based on at least one factor, wherein the preferred bias current results in an output power that is within a desired output range and provides a ΔI that enables each sample transceiver to provide output at an adequate speed and without operating in a roll-over region;

determining an average bias current by averaging the preferred bias currents of the sample transceivers; and setting the average bias current as the bias current for each transceiver in the group of transceivers.

12. A method as defined in claim 11, wherein applying a plurality of bias currents to each sample further comprises at least one of:

selecting each bias current as being a fixed amount over the threshold current;

selecting each bias current as being a predetermined percentage above the threshold current; and selecting each bias current as being a combination of the threshold current and a slope efficiency.

13. A method as defined in claim 11, wherein determining a preferred bias current for each sample transceiver based on at least one factor further comprises determining the preferred bias current based on a current setting, wherein the current setting is related to a jitter, a mask margin, and an output power.

14. A method as defined in claim 11, wherein determining the preferred bias current based on a current setting further comprises:

determining when a jitter exceeds a predetermined limit;

determining when a mask margin decreases below an predetermined value; and determining when the output power moves outside a particular power band.

15. A method for determining a bias current for a laser, the method comprising:

determining a threshold current of a laser;

applying a plurality of bias currents to the laser, each bias current being related to the threshold current;

adjusting an extinction ratio of the laser to a specification for each bias current;

measuring a mask margin for each bias current applied to the laser; and determining a preferred bias current for the laser, the determination being based at least in part upon the measured mask margins.

16. The method as recited in claim 15, wherein each of the plurality of bias currents are one of:

a different fixed value above the threshold current;

a different predetermined percentage above the threshold current; and a different combination of the threshold current and a slope efficiency of the laser.

17. The method of claim 15, wherein a relationship between the preferred bias current and the mask margins is such that a mask margin lower than a predetermined value is indicative that the preferred bias current has been exceeded.

* * * * *